United States Patent
Huang

(10) Patent No.: US 10,204,952 B2
(45) Date of Patent: Feb. 12, 2019

(54) SEMICONDUCTOR DEVICE HAVING RECESS FILLED WITH CONDUCTIVE MATERIAL AND METHOD OF MANUFACTURING THE SAME

(71) Applicant: TAIWAN SEMICONDUCTOR MANUFACTURING COMPANY LTD., Hsinchu (TW)

(72) Inventor: Yin-Chieh Huang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 85 days.

(21) Appl. No.: 14/472,370

(22) Filed: Aug. 29, 2014

(65) Prior Publication Data

US 2016/0064438 A1 Mar. 3, 2016

(51) Int. Cl.
H01L 27/146 (2006.01)

(52) U.S. Cl.
CPC .... *H01L 27/14634* (2013.01); *H01L 27/1462* (2013.01); *H01L 27/1469* (2013.01); *H01L 27/14623* (2013.01); *H01L 27/14636* (2013.01); *H01L 27/14621* (2013.01); *H01L 27/14627* (2013.01); *H01L 27/14645* (2013.01)

(58) Field of Classification Search
None
See application file for complete search history.

(56) References Cited

U.S. PATENT DOCUMENTS

| | | | |
|---|---|---|---|
| 2004/0147068 A1* | 7/2004 | Toyoda | H01L 27/1462 438/197 |
| 2009/0065824 A1* | 3/2009 | Hwang | H01L 27/14634 257/292 |
| 2009/0065825 A1* | 3/2009 | Hwang | H01L 27/1463 257/292 |
| 2010/0207226 A1* | 8/2010 | Park et al. | 257/432 |
| 2011/0157445 A1* | 6/2011 | Itonaga | H01L 21/76898 348/308 |
| 2014/0094030 A1* | 4/2014 | Shimotsusa | 438/652 |
| 2015/0221695 A1* | 8/2015 | Park | H01L 27/14636 257/774 |

* cited by examiner

*Primary Examiner* — Shaun M Campbell
*Assistant Examiner* — Aneta B Cieslewicz
(74) *Attorney, Agent, or Firm* — WPAT, P.C., Intellectual Property Attorneys; Anthony King

(57) ABSTRACT

A semiconductor device includes a first semiconductor chip comprising a first metallic structure and a second semiconductor chip comprising a second metallic structure. The second semiconductor chip is bonded with the first semiconductor chip by a conductive material filled in a through via. The through via connects the first metallic structure and the second metallic structure, wherein a portion of the through via is inside the first semiconductor chip and the second semiconductor chip.

20 Claims, 10 Drawing Sheets

SEMICONDUCTOR DEVICE HAVING RECESS FILLED WITH CONDUCTIVE MATERIAL AND METHOD OF MANUFACTURING THE SAME

FIELD

The present disclosure relates to a semiconductor image sensing device.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors that can absorb radiation projected toward the substrate and convert the sensed radiation into electrical signals.

A back side illuminated (BSI) image sensor device is one type of image sensor device. As transistor device size shrinks with each technology generation, existing BSI image sensor devices may begin to suffer from issues related to cross-talk and blooming. These issues may be caused by insufficient isolation between neighboring pixels of the BSI image sensor. Therefore, while existing methods of fabricating BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
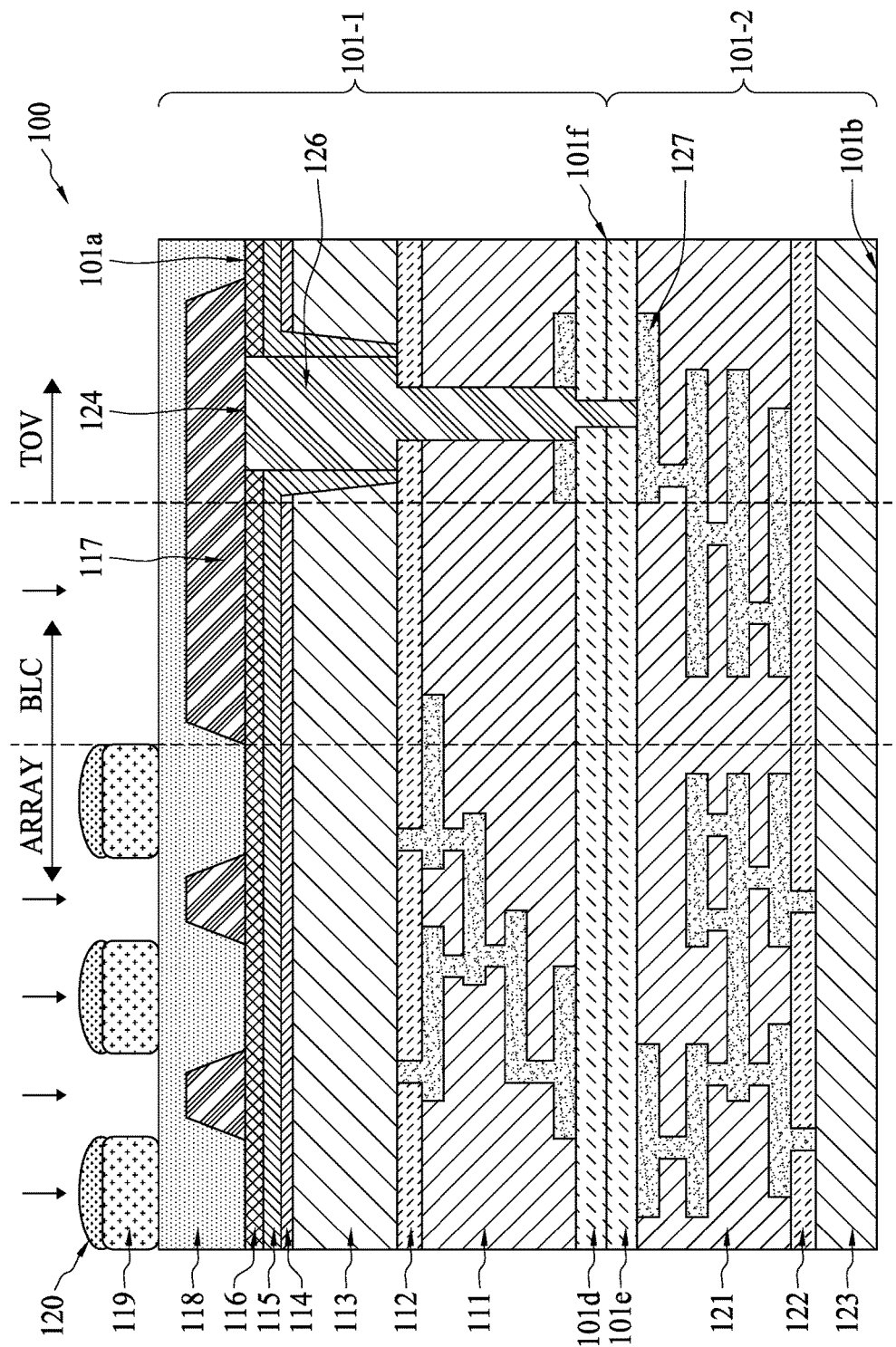
FIG. 1 is a cross-sectional view illustrating a backside illuminated (BSI) image sensor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A semiconductor device is manufactured by a number of operations. During the manufacturing, an electrical interconnection structure is formed between a number of conductive metallic structures across a number of insulating layers of at least two semiconductor chips in the semiconductor device. The conductive metallic structures are connected with each other by piercing a number of trenches or vias from a semiconductor chip to another semiconductor chip. The trench is formed by etching through the semiconductor chips. The trench is then coated or filled with a conductive material, so that the conductive metallic structures are electrically connected across the semiconductor chips through the trench coated or filled with the conductive material.

However, during process of manufacturing the above-mentioned semiconductor device, schottky contact may happen on a grounding contact of the semiconductor device. Electrons are remained near an upper surface of a substrate of a semiconductor chip and thus a leakage current is formed which degrades the reliability of the semiconductor device. To reduce the leakage current, new structures of a BSI semiconductor device are illustrated as follows.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved electrical interconnection structure is disclosed. The electrical interconnection structure includes a through via (TOV) to connect a first metallic structure to a second metallic structure for directing electrons remained in a first substrate to ground and thus reduce a leakage current of the semiconductor device.

In reference to the drawings, FIG. 1 is a cross-sectional view illustrating a BSI image sensor device 100 in accordance with some embodiments of the present disclosure. The BSI image sensor device 100 includes various features such as a first semiconductor chip 101-1 and a second semiconductor chip 101-2. The first semiconductor chip 101-1 and the second semiconductor chip 101-2 are bonded and interconnected by a through via 124. An interface 101f is formed between the first semiconductor chip 101-1 and the second semiconductor chip 101-2. The through via 124 includes conductive material 126. A first metallic structure 117 of the first semiconductor chip 101-1 is on a first surface 101a of the first semiconductor chip 101-1, wherein the first surface 101a is opposite to the interface 101f. The first metallic structure 117 is in contact with the through via 124. The through via 124 is over and in contact with a second metallic structure 127 of the second semiconductor chip 101-2. In other words, the first metallic structure 117 of the first semiconductor chip 101-1 interconnects with the second metallic structure 127 of the second semiconductor chip 101-2.

In first semiconductor chip 101-1, various features are included and disposed between the interface 101f and the first surface 101a. For example, there is an inter-metal dielectric (IMD) layer 111 proximal to the interface 101f and some conductive traces laid in two or three dimensions are embedded in the IMD layer 111. Between the IMD layer 111 and the first surface 101a, other dielectric material, such as an inter-layer dielectric (ILD) layer 112 is disposed. A first substrate 113 is arranged to be adjacent to the ILD layer 112. The first substrate 113 may include some devices such as photodiodes and transistors.

In some embodiments, the first semiconductor chip 101-1 is configured as an image sensing chip. Some optical devices such as micro lenses 120, color filters 119 are disposed over the first surface 101a in order to receive incident lights. For some embodiments, the first surface 101a is also called a backside of the first semiconductor chip 101-1 such that the first semiconductor chip 101-1 is designed to be a back side illuminated (BSI) image sensor device.

Some structures are introduced into the first semiconductor chip 101-1 in order to enhance the performance. For example, an anti-reflective coating (ARC) 114 is disposed between a first substrate 113 and the first surface 101a. Some dielectric layers like 115 and 116 can be inserted between the first substrate 113 and the first surface 101a and dielectric layer 118 can be disposed adjacent to the first surface 101a for various design requirements. The dielectric layers include electrical insulative material such as silicon oxide, silicon nitride, and etc. A plurality of metal grids and the first metallic structure 117 are disposed in dielectric layer 118. Color filters 119 and micro lenses 120 are arranged to be inside openings of the plurality of metal grids. The relative position between the dielectric layers illustrated in FIG. 1 is interchangable and not deemed as a limitation.

In some embodiments, the first semiconductor chip 101-1 is a semiconductor image sensor chip and comprises an array region, a black level collection (BCL) region and a through oxide via (TOV) region. In some embodiments, the first semiconductor chip 101-1 is fabricated by a complementary metal-oxide-semiconductor (CMOS) process technique. The CIS chip is configured for capturing a light and converting the light into an electrical signal. In some embodiments, the first metallic structure 117 is disposed over the BCL region of the first semiconductor chip 101-1. The first metallic structure 117 is configured to block ambient lights entering into the first semiconductor chip 101-1 in order to eliminate noise generated in the BCL.

In some embodiments, the first substrate 113 of the first semiconductor chip 101-1 includes silicon, germanium, gallium, arsenic, and combinations thereof. In some embodiments, the first substrate 113 is in a form of SOI including a layer of a semiconductor material (e.g., silicon, germanium and/or the like) formed above an insulator layer (e.g., buried oxide and/or the like). In some embodiments, the first substrate 113 includes multi-layered substrates, gradient substrates, hybrid orientation substrates, any combinations thereof and/or the like.

In some embodiments, the first semiconductor chip 101-1 and the second semiconductor chip 101-2 are bonded together through any suitable bonding techniques such as direct bonding. In some embodiments, the first semiconductor chip 101-1 and the second semiconductor chip 101-2 are bonded together by a metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

In some embodiments, various features are included and disposed between the interface 101f and a second surface 101b. For example, there is a second IMD layer 121 proximal to the interface 101f and some conductive traces laid in two or three dimensions are embedded in the second IMD layer 121. Between the second IMD layer 121 and the second surface 101b, other dielectric materials, such as a second ILD layer 122 is disposed. In some embodiments, a second substrate 123 is arranged to be proximal to the second surface 101b and the second substrate 123 includes silicon, germanium, gallium, arsenic, and combinations thereof. In some embodiments, the second substrate 123 is in a form of SOL. In some embodiments, the second substrate 123 is multi-layered substrates, gradient substrates, hybrid orientation substrates, any combinations thereof and/or the like.

In some embodiments, the first IMD layer 111 and the second IMD layer 121 respectively include a dielectric material for isolating metallic structures inside the first IMD layer 111 and the second IMD layer 121. In some embodiments, the first IMD layer 111 and the second IMD layer 121 include various dielectric materials used in integrated circuit fabrication. In some embodiments, the first IMD layer 111 and the second IMD layer 121 include silicon dioxide, silicon nitride or a doped glass layer such as boron silicate glass, black diamond, silicon carbide, and the like. In some embodiments, the first IMD layer 111 and the second IMD layer 121 are formed using suitable techniques such as oxidation, CVD and/or the like.

In some embodiments, the second semiconductor chip 101-2 is a semiconductor application specific integrated circuit (ASIC) chip which is configured for a particular application. In some embodiments, the second semiconductor chip 101-2 includes several logic circuits such as an analog-to-digital converter, a data processing circuit, a memory circuit, a bias circuit, a reference circuit, any combinations thereof and/or the like.

In some embodiments, the second metallic structure 127 of the second semiconductor chip 101-2 is disposed within the second IMD layer 121. In some embodiments, the second metallic structure 127 includes gold, silver, copper, nickel, tungsten, aluminum, palladium and/or alloys thereof.

In some embodiments, the interface 101*f* is disposed between a passivation layer 101*d* of the first semiconductor chip 101-1 and a passivation layer 101*e* of the second semiconductor chip 101-2. In some embodiments, the passivation layer 101*d* and the passivation layer 101*e* are respectively including silicon oxide, silicon nitride, and can be a composite structure, hybrid bond, bonding interface including metal such as copper, and dielectric such as silicon oxide or silicon nitride.

The first and second semiconductor chips are electrically connected by the through via 124. The through via 124 extends from the first surface 101*a* of the first semiconductor chip 101-1 into the second semiconductor chip 101-2. For some embodiments, the first metallic structure 117 is electrically connected with the second metallic structure 127 by the through via 124. For some embodiments, one end of the through via 124 lands on the second metallic structure 127. The first metallic structure 117 is substantially coplanar with a metal grid of the first semiconductor chip 101-1, wherein the metal grids are configured to be over a plurality of image pixels (not shown) in the first substrate 113.

The depth of the through via 124 varies depending on different applications and design needs. In some embodiments, the through via has a depth greater than about 4.0 um. In some embodiments, the through via 124 includes an aspect ratio between about 1 to about 10. The through via 124 includes gold, silver, copper, nickel, tungsten, aluminum, palladium and/or alloys thereof.

In some embodiment, during process of manufacturing the above-mentioned semiconductor device, schottky contact may happen on a grounding contact of the semiconductor device. Electrons are remained near an upper surface of the first substrate 113 and thus a leakage current is formed which degrades the reliability of the semiconductor device. The electrons remained in the first substrate 113 may be directed to the second metallic structure 127 through the through via 124. By using the new structure illustrated in FIG. 1, the electrons in the first substrate 113 would not remain and thus no leakage current is formed.

Figure 2:
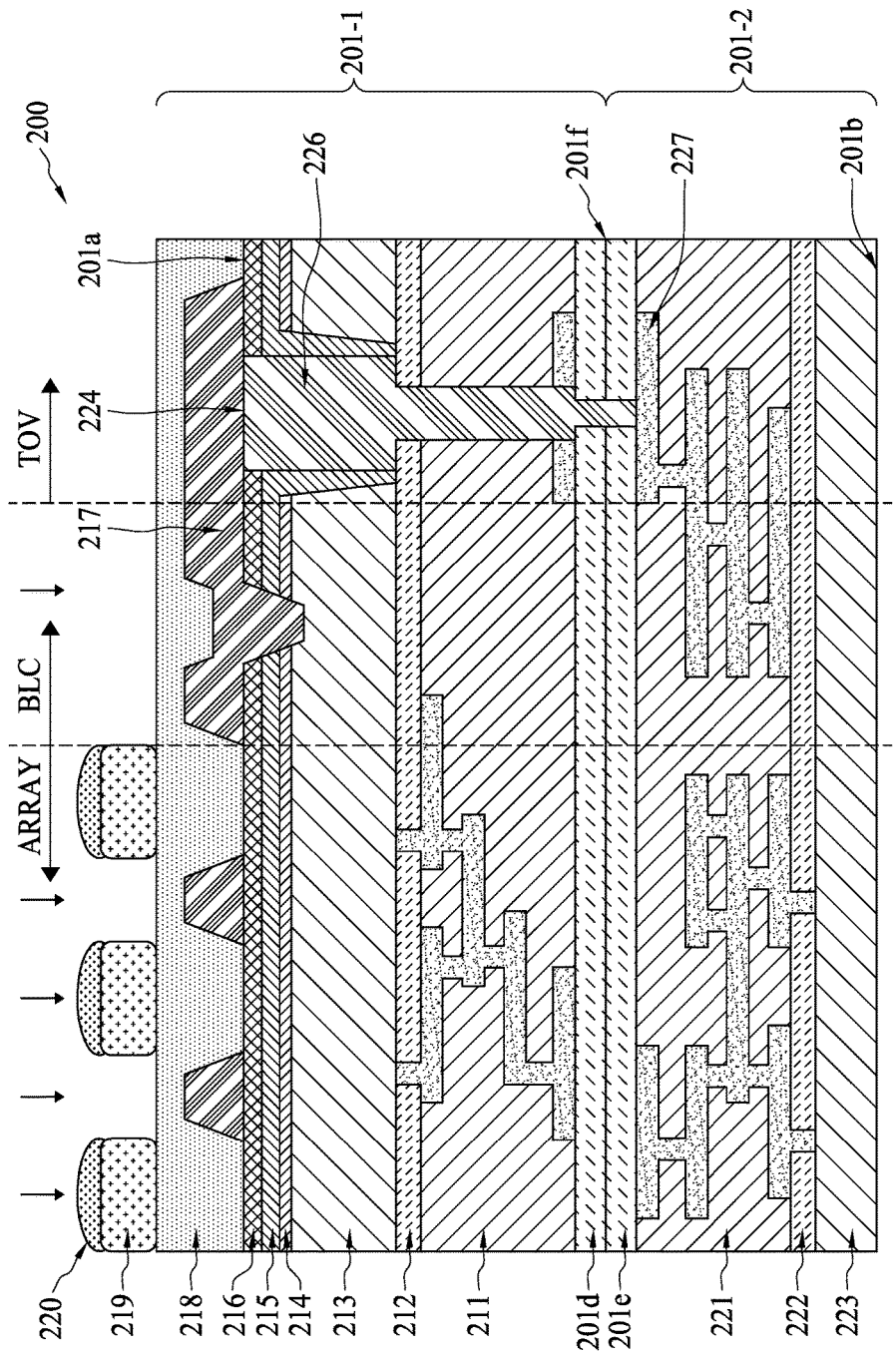
FIG. 2 is a cross-sectional view illustrating a backside illuminated (BSI) image sensor device in accordance with some embodiments.

FIG. 2 is a cross-sectional view illustrating a BSI image sensor device 200 in accordance with some embodiments of the present disclosure. The BSI image sensor device 200 includes various features such as a first semiconductor chip 201-1 and a second semiconductor chip 201-2. The first semiconductor chip 201-1 and the second semiconductor chip 201-2 are bonded and electrically interconnected by a through via 224. An interface 201*f* is formed between the first semiconductor chip 201-1 and the second semiconductor chip 201-2. The through via 224 includes conductive material 226. A first metallic structure 217 of the first semiconductor chip 201-1 is on a first surface 201*a* of the first semiconductor chip 201-1, wherein the first surface 201*a* is opposite to the interface 201*f*. The first metallic structure 217 is in contact with the through via 224. The through via 224 is formed above and in contact with a second metallic structure 227 of the second semiconductor chip 201-2. In other words, the first metallic structure 217 of the first semiconductor chip 201-1 interconnects with the second metallic structure 227 of the second semiconductor chip 201-2. A portion of the first metallic structure 217 protrudes through the first surface 201*a* and towards a first substrate 213 of the first metallic structure 201-1. In some embodiments, the portion of the first metallic structure 217 is in contact with the first substrate 213.

In first semiconductor chip 201-1, various features are included and disposed between the interface 201*f* and the first surface 201*a*. For example, there is an (IMD layer 211 proximal to the interface 201*f* and some conductive traces laid in two or three dimensions are embedded in the IMD layer 211. Between the IMD layer 211 and the first surface 201*a*, other dielectric material, such as an ILD layer 212 is disposed. A first substrate 213 is arranged to be adjacent to the ILD layer 212. The first substrate 213 may include some devices such as photodiodes and transistors.

In some embodiments, the first semiconductor chip 201-1 is configured as an image sensing chip. Some optical devices such as micro lenses 220, color filters 219 are disposed over the first surface 201*a* in order to receive incident lights. For some embodiments, the first surface 201*a* is also called a backside of the first semiconductor chip 201-1 such that the first semiconductor chip 201-1 is designed to be a back side illuminated (BSI) image sensor device.

Some structures are introduced into the first semiconductor chip 201-1 in order to enhance the performance. For example, an anti-reflective coating (ARC) 214 is disposed between the first substrate 213 and the first surface 201*a*. Some dielectric layers like 215 and 216 can be inserted between the first substrate 213 and the first surface 201*a* and dielectric layer 218 can be disposed adjacent to the first surface 201*a* for various design requirements. The dielectric layers include electrical insulative material such as silicon oxide, silicon, etc. A plurality of metal grids and the first metallic structure 217 are disposed in dielectric layer 218. Color filters 219 and micro lenses 220 are arranged to be inside openings of the plurality of metal grids. The relative position between the dielectric layers illustrated in FIG. 2 is interchangable and not deemed as a limitation.

In some embodiments, the first semiconductor chip 201-1 is a semiconductor image sensor chip and comprises an array region, a BCL region and a TOV region. In some embodiments, the first semiconductor chip 201-1 is fabricated by a CMOS process technique. The CIS chip is configured for capturing a light and converting the light into an electrical signal. In some embodiments, the first metallic structure 217 is disposed over the BCL region of the first semiconductor chip 201-1. The first metallic structure 217 is configured to block ambient lights entering into the first semiconductor chip 201-1 in order to eliminate noise generated in the BCL.

In some embodiments, the first substrate 213 of the first semiconductor chip 201-1 includes silicon, germanium, gallium, arsenic, and combinations thereof. In some embodiments, the first substrate 213 is in a form of SOI including a layer of a semiconductor material (e.g., silicon, germanium and/or the like) formed above an insulator layer (e.g., buried oxide and/or the like). In some embodiments, the first substrate 213 includes multi-layered substrates, gradient substrates, hybrid orientation substrates, any combinations thereof and/or the like.

In some embodiments, the first semiconductor chip 201-1 and the second semiconductor chip 201-2 are bonded together through any suitable bonding techniques such as direct bonding. In some embodiments, the first semiconductor chip 201-1 and the second semiconductor chip 201-2 are bonded together by a metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

In some embodiments, various features are included and disposed between the interface 201*f* and a second surface 201*b*. For example, there is a second inter-metal dielectric (IMD) layer 221 proximal to the interface 201*f* and some conductive traces laid in two or three dimensions are embedded in the second IMD layer 221. Between the second IMD layer 221 and the second surface 201b, other dielectric materials, such as a second ILD layer 222 is disposed. In some embodiments, a second substrate 223 is arranged to be proximal to the second surface 101b and the second substrate 223 includes silicon, germanium, gallium, arsenic, and combinations thereof. In some embodiments, the second substrate 223 is in a form of SOL. In some embodiments, the second substrate 223 is multi-layered substrates, gradient substrates, hybrid orientation substrates, any combinations thereof and/or the like.

In some embodiments, the first IMD layer 211 and the second IMD layer 221 respectively include a dielectric material for isolating metallic structures inside the first layer 211 and the second IMD layer 221. In some embodiments, the first IMD layer 211 and the second IMD layer 221 include various dielectric materials used in integrated circuit fabrication. In some embodiments, the first IMD layer 211 and the second IMD layer 221 include silicon dioxide, silicon nitride or a doped glass layer such as boron silicate glass, black diamond, silicon carbide, and the like. In some embodiments, the first IMD layer 211 and the second IMD layer 221 are formed using suitable techniques such as oxidation, CVD and/or the like.

In some embodiments, the second semiconductor chip 201-2 is a semiconductor ASIC chip which is configured for a particular application. In some embodiments, the second semiconductor chip 201-2 includes several logic circuits such as an analog-to-digital converter, a data processing circuit, a memory circuit, a bias circuit, a reference circuit, any combinations thereof and/or the like.

In some embodiments, the second metallic structure 227 of the second semiconductor chip 201-2 is disposed within the second IMD layer 221. In some embodiments, the second metallic structure 227 includes gold, silver, copper, nickel, tungsten, aluminum, palladium, and/or alloys thereof.

In some embodiments, the interface 201f is disposed between a passivation layer 201d of the first semiconductor chip 201-1 and a passivation layer 201e of the second semiconductor chip 201-2. In some embodiments, the passivation layer 201d and the passivation layer 201e respectively include silicon oxide, silicon nitride, and can be a composite structure, hybrid bond, bonding interface including metal such as copper, and dielectric such as silicon oxide or silicon nitride.

The first and second semiconductor chips are electrically connected by the through via 224. The through via 224 extends from the first surface 201a of the first semiconductor chip 201-1 into the second semiconductor chip 201-2. For some embodiments, the first metallic structure 217 is electrically connected with the second metallic structure 227 by the through via 224. For some embodiments, one end of the through via 224 lands on the second metallic structure 227. The first metallic structure 217 is substantially coplanar with a metal grid of the first semiconductor chip 201-1, wherein the metal grids are configured to be over a plurality of image pixels (not shown) in the first substrate 213.

The depth of the through via 224 varies depending on different applications and design needs. In some embodiments, the through via has a depth greater than about 4.0 um. In some embodiments, the through via 224 includes an aspect ratio between about 1 to about 10. The through via 224 includes gold, silver, copper, nickel, tungsten, aluminum, palladium, and/or alloys thereof.

In some embodiments, a portion of the first metallic structure 217 protrudes through the first surface 201a and towards a first substrate 213 of the first semiconductor chip 201-1. In some embodiments, the portion of the first metallic structure 217 is in contact with the first substrate 213. Therefore, the first substrate 213 is electrically connected to the second metallic structure 227 through the portion of the first metallic structure 217 and the through via 224.

In some embodiment, during process of manufacturing the above-mentioned semiconductor device, schottky contact may happen on a grounding contact of the semiconductor device. Electrons are remained near an upper surface of the first substrate 213 and thus a leakage current is formed which degrades the reliability of the semiconductor device. The electrons remained in the first substrate 213 may be directed to the second metallic structure 227 through the portion of the first metallic structure 217 and the through via 224. By using the new structure illustrated in FIG. 2, the electrons in the first substrate 213 would not remain and thus no leakage current is formed.

Figure 3:
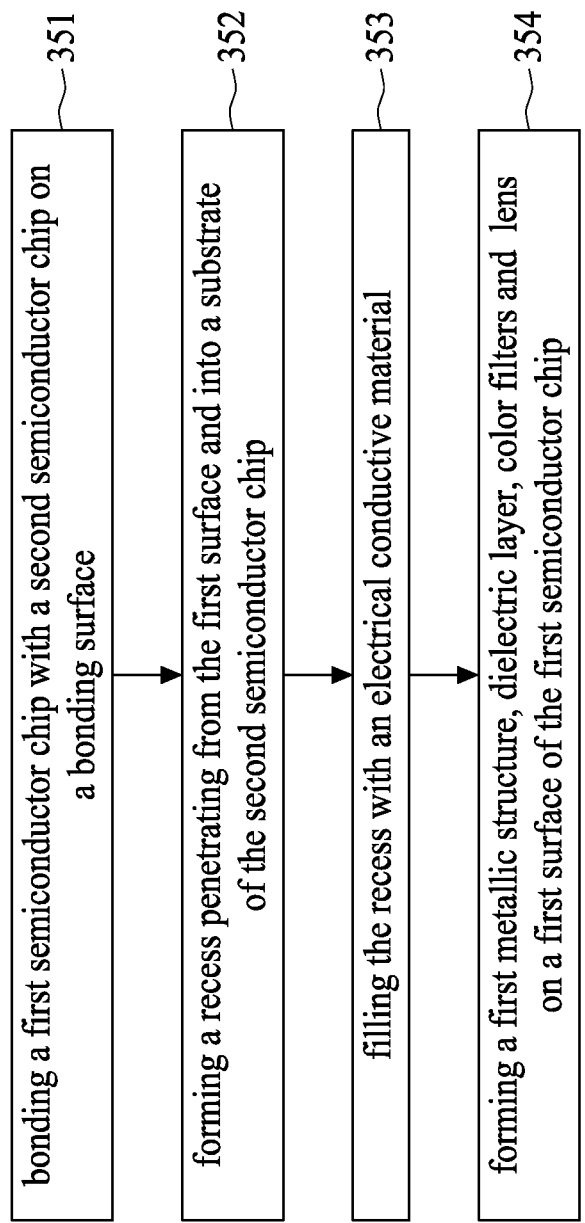
FIGS. 3 and 4 are respectively flow diagrams of a method of manufacturing a semiconductor device in accordance with FIGS. 1 and 2 of the present disclosure.

FIG. 3 is a flowchart of a method 300 of manufacturing the semiconductor device as shown in FIG. 1. The method 300 includes a number of operations. In operation 351, a first semiconductor chip 301-1 and a second semiconductor chip 301-2 are provided. In some embodiments, the first semiconductor chip 301-1 and the second semiconductor chip 301-2 are bonded together through any suitable bonding techniques such as direct bonding. In some embodiments, the first semiconductor chip 301-1 and the second semiconductor chip 301-2 are bonded at an interface 301f between passivation layer 301d of the first semiconductor chip 301-1 and passivation layer 301e of the second semiconductor chip 301-2. For some examples, there are few types of bonding techniques are available for operation 351. One type is called adhesive bond in which an intermediate layer is introduced to connect the first and second semiconductor chip. The intermediate layer can be optionally remained on the interface 301f. Another type is called direct bond in which a suitable energy (such as heat, laser, etc.) is introduced to connect the first and second semiconductor chip through certain transformation of the bonding surfaces. In FIG. 3B, the first semiconductor chip 301-1 and the second semiconductor chip 301-2 are drawn to be directly bonded without mentioning an intermediate layer. However, it should not be treated that the adhesive bond is excluded in the present disclosure.

Figure 3A:
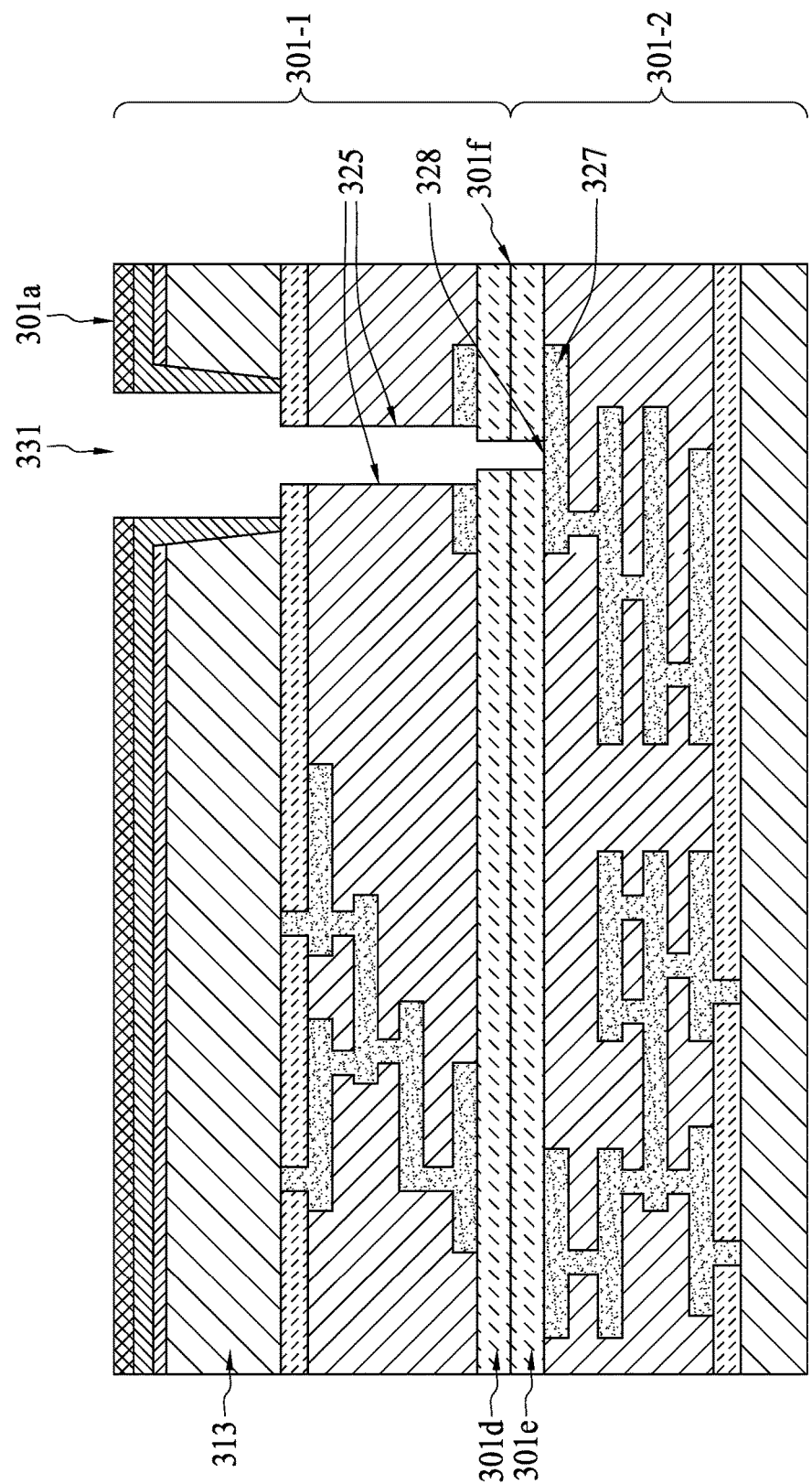
FIGS. 3A-3C represent a method of manufacturing a backside illuminated (BSI) image sensor device in accordance with FIG. 1 of the present disclosure.
Figure 3B:
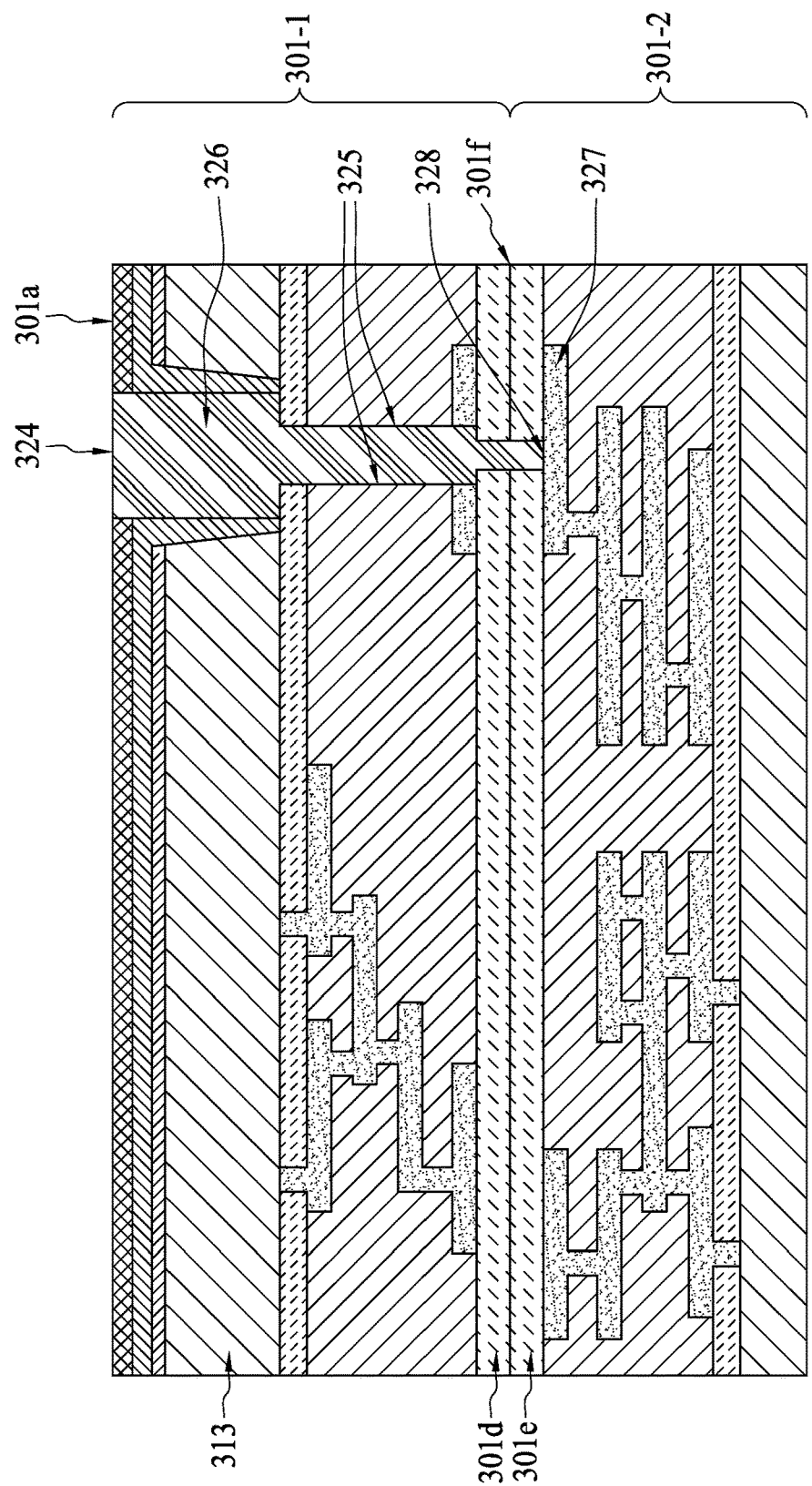

In operation 352, a recess 331 is formed as in FIG. 3A. The recess 331 extends from a first surface 301a of the first semiconductor chip 301-1 and into a substrate 313 of the second semiconductor chip 301-2. The recess 331 includes a sidewall 325 and a bottom surface 328. The bottom surface 328 may be disposed on or within the second metallic structure 327. In some embodiments, the recess 331 is formed by anisotropically etching operations. In some embodiments, the recess 331 is formed by suitable deposition and photolithography techniques such as a reactive ion etch (RIE) or other dry etch, an anisotropic wet etch, any other suitable anisotropic etching or etc.

In operation 353, an electrical conductive material 326 is disposed on the sidewall 325 of the recess 331 and filled in the recess 331 to form a through via 324 as in FIG. 3B. In some embodiments, the conductive material 326 is formed by electroplating or sputtering and removed by etching or other methods.

Figure 3C:
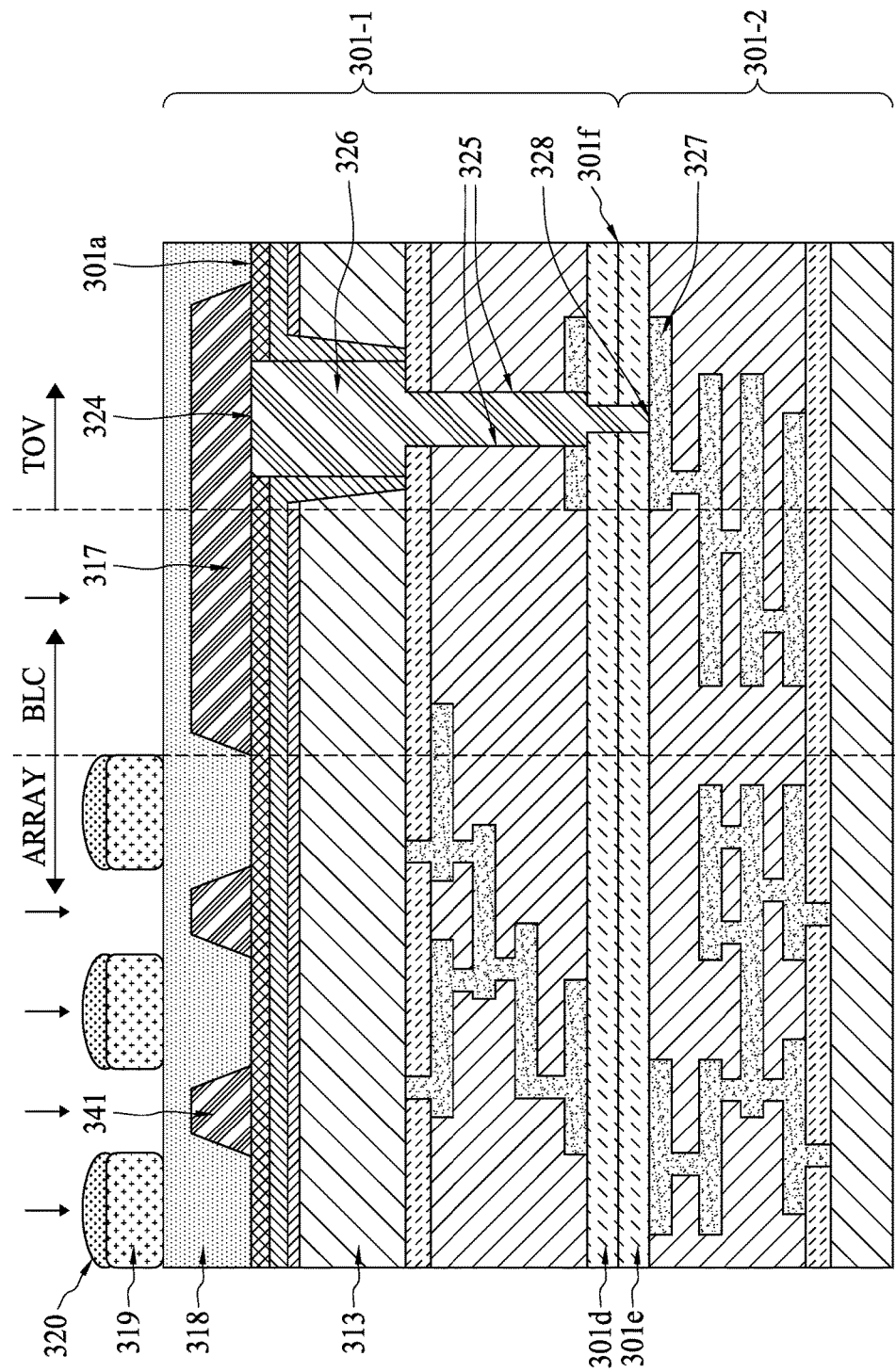

In operation 354, a metallic structure 317 is provided as in FIG. 3C. The metallic structure 317 is formed over the first surface 301a of the first semiconductor chip 301-1 and is then electrically connected with the second semiconductor chip 301-2 via the through via 324 extending from the first surface 301a of the first semiconductor 301-1 to the bottom surface 328 of the recess 331. A metal grid 341 is also formed simultaneously with the metallic structure 317 and the metal grid 341 is in the array region of the first semiconductor chip 301-1. In some embodiments, a dielectric layer 318, color filters 319, and micro lenses 320 are formed.

Figure 4:
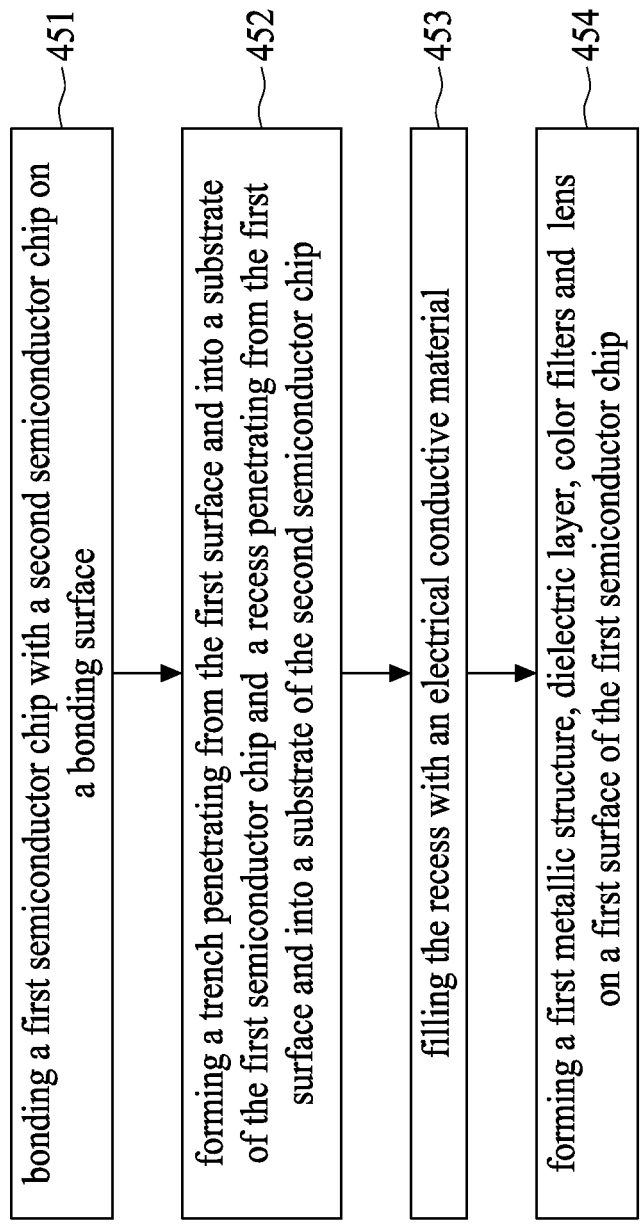

FIG. 4 is a flowchart of a method 400 of manufacturing a semiconductor device as shown in FIG. 2. The method 400 includes a number of operations. In operation 451, a first semiconductor chip 401-1 and a second semiconductor chip 401-2 are provided. In some embodiments, the first semiconductor chip 401-1 and the second semiconductor chip 401-2 are bonded together through any suitable bonding techniques such as direct bonding. In some embodiments, the first semiconductor chip 401-1 and the second semiconductor chip 401-2 are bonded at an interface 401f between passivation layer 401d of the first semiconductor chip 401-1 and passivation layer 401e of the second semiconductor chip 401-2. For some examples, there are few types of bonding techniques are available for operation 451. One type is called adhesive bond in which an intermediate layer is introduced to connect the first and second semiconductor chip. The intermediate layer can be optionally remained on the interface 401f. Another type is called direct bond in which a suitable energy (such as heat, laser, etc.) is introduced to connect the first and second semiconductor chip through certain transformation of the bonding surfaces. In FIG. 4B, the first semiconductor chip 401-1 and the second semiconductor chip 401-2 are drawn to be directly bonded without mentioning an intermediate layer. However, it should not be treated that the adhesive bond is excluded in the present disclosure.

Figure 4A:
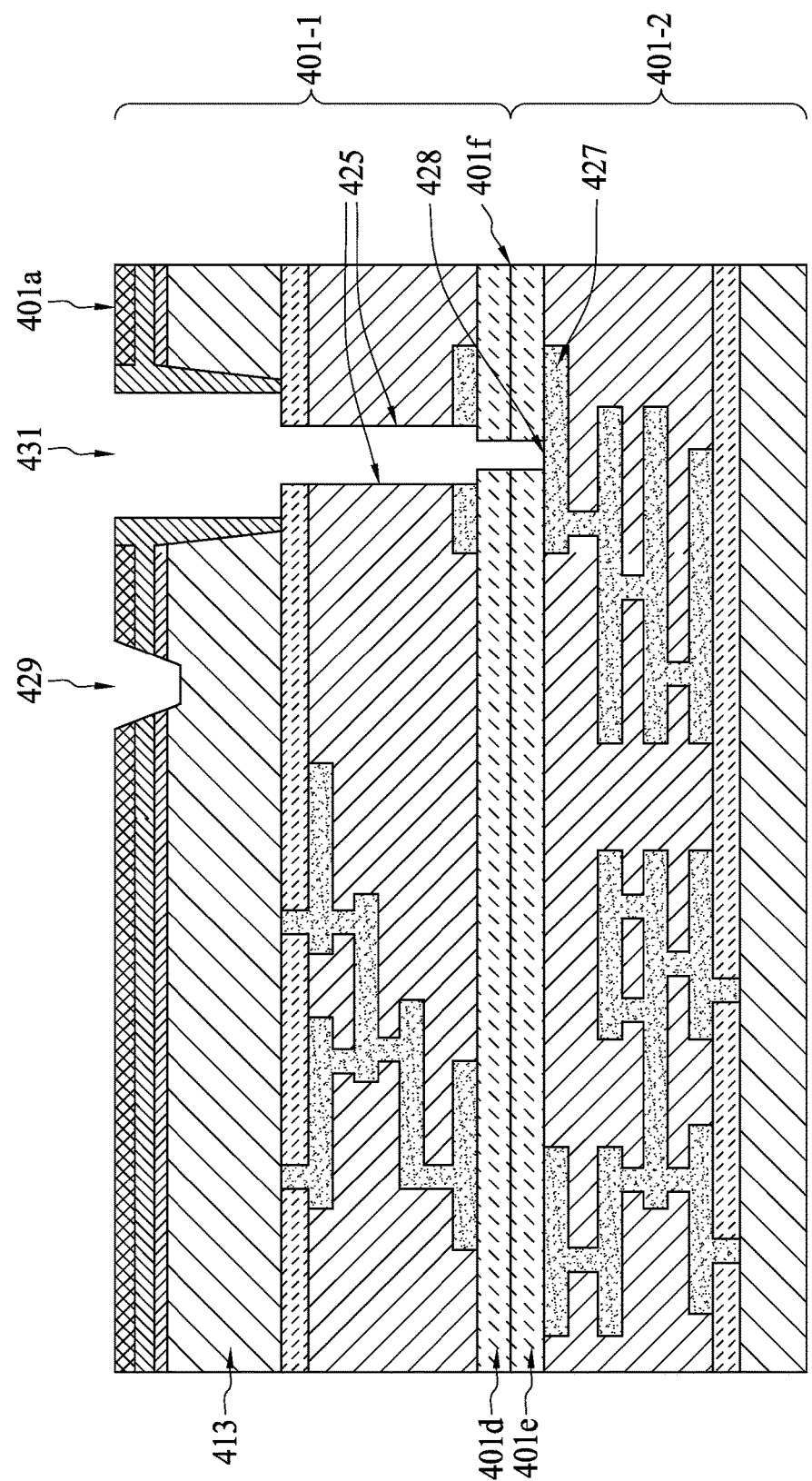
FIGS. 4A-4C represent a method of manufacturing a backside illuminated (BSI) image sensor device in accordance with FIG. 2 of the present disclosure.
Figure 4B:
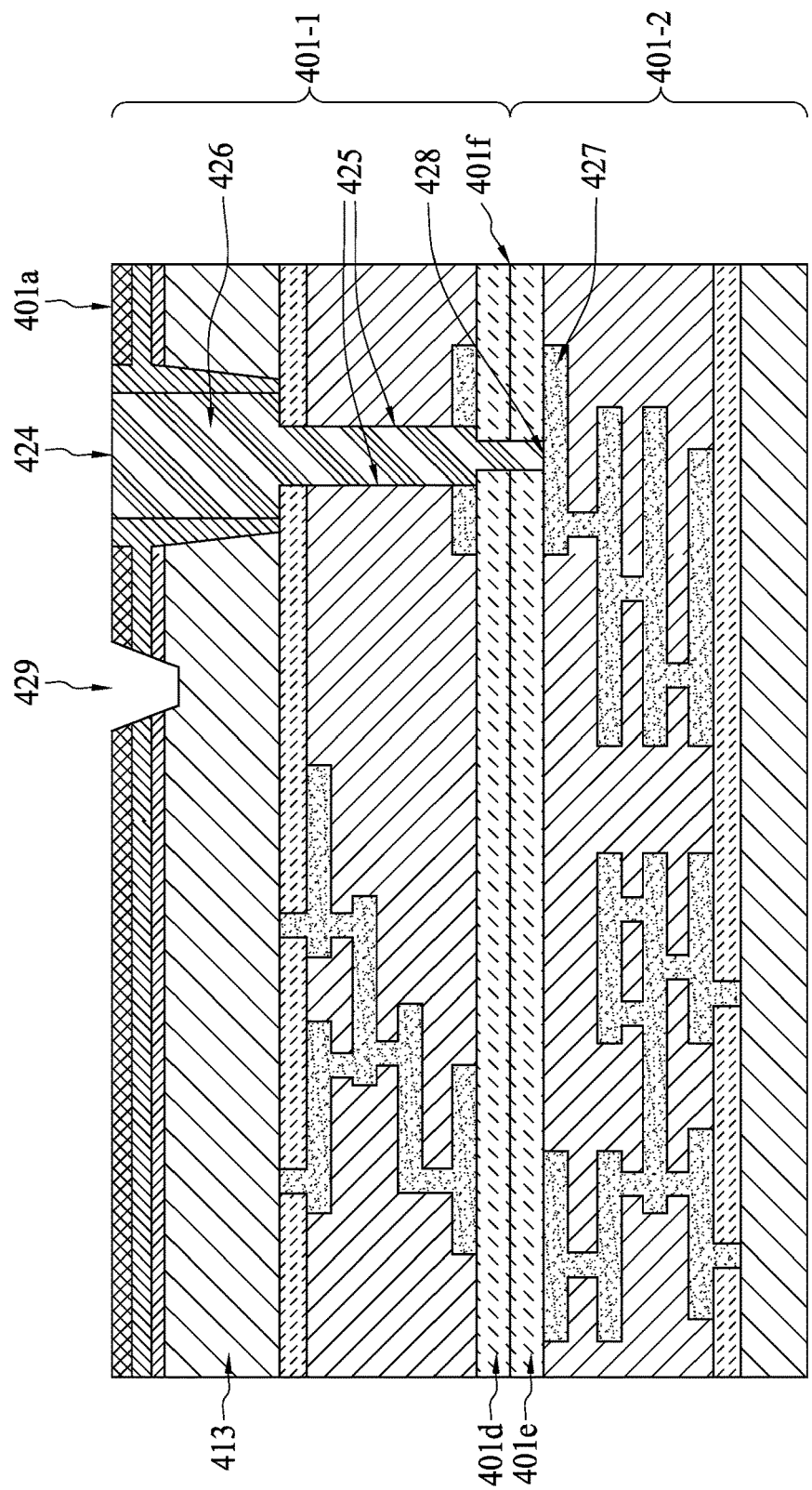

In operation 452, a trench 429 and a recess 431 are formed as in FIG. 4A. The trench 429 extends from a first surface 401a of the first semiconductor chip 401-1 and into a substrate 413 of the first semiconductor chip 401-1. The trench 429 includes a sidewall 430 and a bottom surface of the trench 429. The recess 431 extends from the first surface 401a of the first semiconductor chip 401-1 and into a substrate 413 of the second semiconductor chip 401-2. The recess 431 includes a sidewall 425 and a bottom surface 428 of the recess 431. The bottom surface 428 may be disposed on or within the second metallic structure 427. In some embodiments, the trench 429 and the recess 431 are formed by anisotropically etching operations. In some embodiments, the trench 429 and the recess 431 are formed by suitable deposition and photolithography techniques such as a reactive ion etch (RIE) or other dry etch, an anisotropic wet etch, any other suitable anisotropic etching or etc.

In operation 453, an electrical conductive material 426 is disposed on the sidewall 425 of the recess 431 and filled in the recess 431 to form a through via 424 as in FIG. 4B. In some embodiments, the conductive material 426 is formed by electroplating or sputtering and removed by etching or other methods.

Figure 4C:
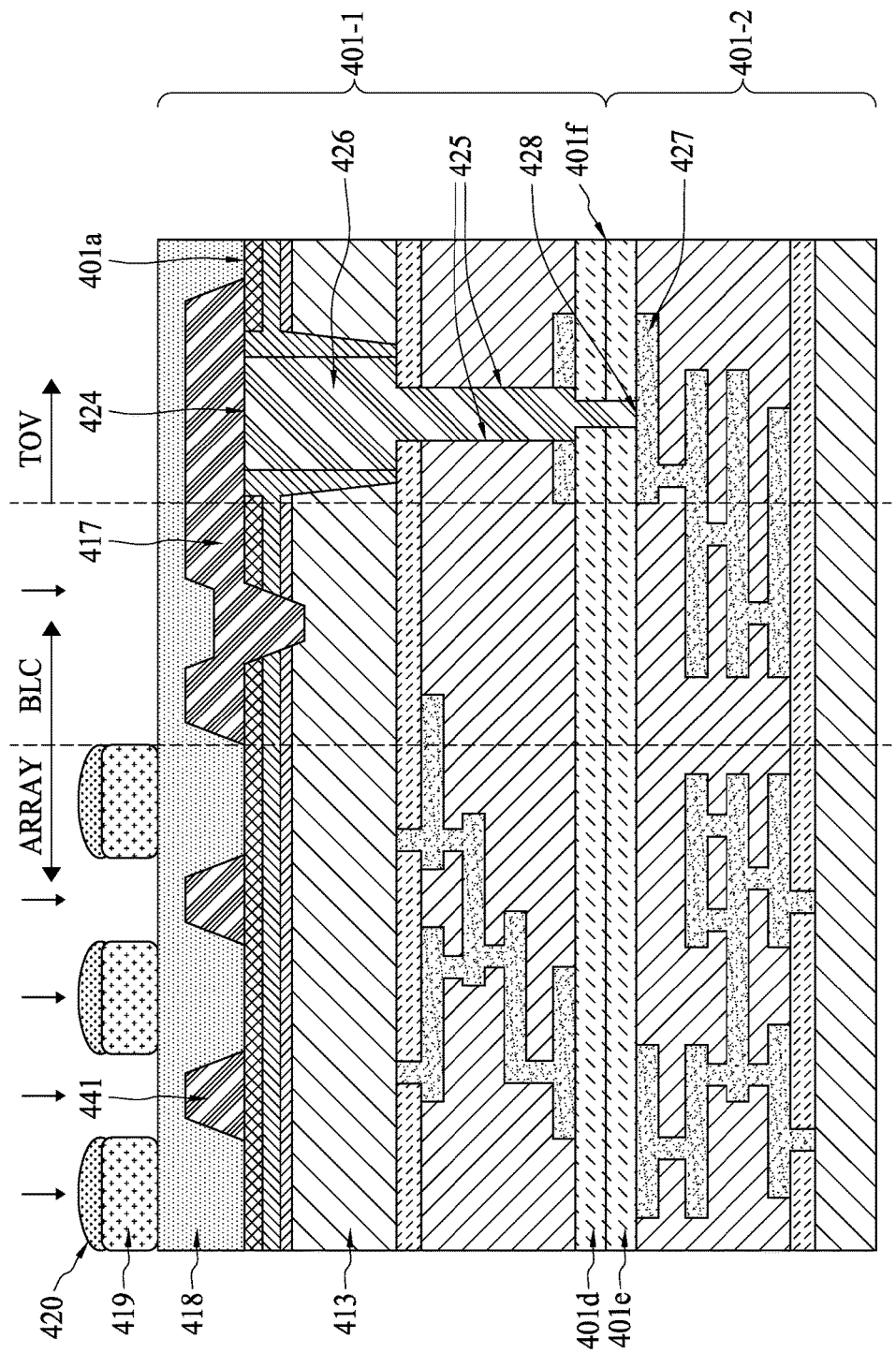

In operation 454, a metallic structure 417 is provided as in FIG. 4C. The metallic structure 417 is formed over the first surface 401a of the first semiconductor chip 401-1 and is then electrically connected with the second semiconductor chip 401-2 via the through via 424 extending from the first surface 401a of the first semiconductor 401-1 to the bottom surface 428 of the recess 431. In some embodiments, the trench 429 is filled with the same material of the first metallic structure 417. The trench is formed through the first surface 401a and penetrating into the substrate 413 of the first semiconductor chip 401-1. A metal grid 441 is also formed simultaneously with the metallic structure 417 and the metal grid 441 is in the array region of the first semiconductor chip 401-1. In some embodiments, a dielectric layer 418, color filters 419, and micro lenses 420 are formed.

In some embodiments, a semiconductor device includes a first semiconductor chip comprising a first surface, a second surface opposite to the first surface, and a first metallic structure made of a conductive material above the first surface, wherein the first metallic structure is configured to block incident light entering into an optical sensing region of the first semiconductor chip through the first surface. In some embodiments, the semiconductor device includes a second semiconductor chip comprising a second metallic structure and bonded with the first semiconductor chip on the second surface. In some embodiments, the semiconductor device includes a recess extended from the first surface of the first semiconductor chip to the second metallic structure, wherein the recess includes a sidewall and a bottom surface disposed on or within the second metallic structure. In some embodiments, the semiconductor device includes a conductive material filled in the recess, wherein the first metallic structure directly contacts with the conductive material and is electrically connected with the second metallic structure through the conductive material.

In some embodiments, a semiconductor device includes a first semiconductor chip comprising: a first surface; a second surface opposite to the first surface; a substrate under the first surface. In some embodiments, the semiconductor device includes a first metallic structure above the first surface and electrically connected to the substrate, wherein the first metallic structure is made of a conductive material and configured to block incident light entering into an optical sensing region of the first semiconductor chip through the first surface. In some embodiments, the semiconductor device includes a second semiconductor chip comprising a second metallic structure and bonded with the first semiconductor chip on the second surface. In some embodiments, the semiconductor device includes a recess extended from the first surface to the second metallic structure, wherein the recess includes a sidewall and a bottom surface disposed on or within the second metallic structure. In some embodiments, the semiconductor device includes a conductive material filled in the recess, wherein the first metallic structure directly contacts with the conductive material and is electrically connected with the second metallic structure through the conductive material.

In some embodiments, a method of manufacturing a semiconductor device comprising bonding a first semiconductor chip with a second semiconductor chip on a bonding surface and forming a recess penetrating from a first surface and into a substrate of the second semiconductor chip. In some embodiments, the method includes filling the recess with an electrical conductive material and forming a metallic structure on the first surface of the first semiconductor chip thereby electrically connecting the metallic structure with the electrical conductive material, wherein the first surface is opposite to the bonding surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a first semiconductor chip comprising:
a first dielectric layer, having a first surface;
a substrate, disposed on the first dielectric layer;
an inter-layer dielectric (ILD) layer, disposed on the substrate;
an inter-metal dielectric (IMD) layer, disposed on the ILD layer; and
a passivation layer, disposed on the IMD layer, the passivation layer having a second surface, wherein the second surface is opposite to the first surface, and a first metallic structure made of a first conductive material is in contact with the first surface, wherein the first metallic structure is a single continuous structure and is configured to block incident light entering into an optical sensing region of the first semiconductor chip through the first surface;
a second semiconductor chip comprising a second metallic structure and bonded with the first semiconductor chip on the second surface; and
a T-shaped metallic structure made of a second conductive material penetrating the first dielectric layer, the substrate, the ILD layer, the IMD layer, and the passivation layer to reach the second metallic structure from the first surface, wherein the T-shaped metallic structure includes a first portion with a first width formed in the substrate, a second portion with a second width formed in the ILD layer and the IMD layer, and a third portion with a third width formed in the passivation layer, the first width is greater than the second width, and the second width is greater than the third width, and the first metallic structure directly contacts with the second conductive material and is electrically connected with the second metallic structure through the second conductive material, and the second metallic structure is electrically connected to ground for directing electrons on the first surface to the ground.

2. The semiconductor device of claim 1, wherein the first semiconductor chip comprises an array region, a black level collection (BCL) region and a through via (TOV) region, and the first metallic structure is above the BCL region.

3. The semiconductor device of claim 1, wherein the first conductive material comprises tungsten.

4. The semiconductor device of claim 1, wherein the first semiconductor chip is a semiconductor image sensor chip, and the second semiconductor chip is a semiconductor application specific integrated circuit (ASIC) chip.

5. The semiconductor device of claim 1, wherein the first semiconductor chip further comprises a second dielectric layer disposed on the first dielectric layer.

6. The semiconductor device of claim 1, wherein the second conductive material comprises copper.

7. A semiconductor device, comprising:
a first semiconductor chip comprising:
a dielectric layer, having a first surface;
a substrate, disposed on the dielectric layer;
an inter-layer dielectric (ILD) layer, disposed on the substrate;
an inter-metal dielectric (IMD) layer, disposed on the ILD layer; and
a passivation layer, disposed on the IMD layer, the passivation layer having a second surface opposite to the first surface;
a first metallic structure in contact with the first surface, wherein the first metallic structure is a single continuous structure and is made of a first conductive material, wherein the first metallic structure is configured to block incident light entering into an optical sensing region of the first semiconductor chip through the first surface;
a second semiconductor chip comprising a second metallic structure and bonded with the first semiconductor chip on the second surface; and
a T-shaped metallic structure made of a second conductive material penetrating the dielectric layer, the substrate, the ILD layer, the IMD layer, and the passivation layer to reach the second metallic structure from the first surface, wherein the T-shaped metallic structure includes a first portion with a first width formed in the substrate, a second portion with a second width formed in the ILD layer and the IMD layer, and a third portion with a third width formed in the passivation layer, the first width is greater than the second width, and the second width is greater than the third width, and the first metallic structure directly contacts with the second conductive material and is electrically connected with the second metallic structure through the second conductive material, and the second metallic structure is electrically connected to ground for directing electrons on the first surface to the ground, wherein the T-shaped metallic structure is separated from the substrate by the dielectric layer.

8. The semiconductor device of claim 7, wherein a portion of the first metallic structure protrudes through the first surface and towards the substrate.

9. The semiconductor device of claim 7, wherein a portion of the first metallic structure is in contact with the substrate.

10. The semiconductor device of claim 7, wherein the substrate comprises an image sensing device.

11. The semiconductor device of claim 7, further comprising a lens above the first surface.

12. The semiconductor device of claim 7, wherein the first metallic structure is above a BCL region of the first semiconductor chip.

13. The semiconductor device of claim 7, further comprising an anti-reflective coating (ARC) under the first surface.

14. The semiconductor device of claim 7, wherein the first metallic structure is substantially coplanar with a metal grid of the first semiconductor chip, wherein the metal grid is configured to define a plurality of image pixels of the first semiconductor chip.

15. The semiconductor device of claim 7, wherein the T-shaped metallic structure includes an aspect ratio between about 1 to about 10.

16. A method of manufacturing a semiconductor device, comprising:
forming a first semiconductor chip having a first dielectric layer having a first surface, a substrate disposed on the first dielectric layer, an inter-layer dielectric (ILD) layer disposed on the substrate, an inter-metal dielectric (IMD) layer disposed on the ILD layer, and a passivation layer disposed on the IMD layer, the passivation layer having a bonding surface;
bonding the first semiconductor chip with a second semiconductor chip on the bonding surface;

forming a T-shaped recess penetrating the first dielectric layer, the substrate, the ILD layer, the IMD layer, and the passivation layer to reach the second semiconductor chip from the first surface;

filling the T-shaped recess with an electrically conductive material to form a T-shaped metallic structure, wherein the T-shaped metallic structure includes a first portion with a first width formed in the substrate, a second portion with a second width formed in the ILD layer and the IMD layer, and a third portion with a third width formed in the passivation layer, the first width is greater than the second width, and the second width is greater than the third width; and forming a metallic structure on the first surface of the first dielectric layer thereby electrically connecting the metallic structure with the electrically conductive material, wherein the metallic structure blocks incident light entering into an optical sensing region of the first semiconductor chip through the first surface, wherein the first surface is opposite to the bonding surface, and the metallic structure is a single continuous structure, and the metallic structure is electrically connected to ground for directing electrons on the first surface to the ground.

17. The method of claim 16, further comprising forming a second dielectric layer above the first metallic structure and a metal grid.

18. The method of claim 16, further comprising forming a trench through the first surface and penetrating into the substrate of the first semiconductor chip.

19. The method of claim 16, further comprising forming a color filter on the first surface.

20. The method of claim 16, further comprising forming a metal grid on the first surface of the first semiconductor chip.

\* \* \* \* \*